(12) United States Patent
Shimomura et al.

(10) Patent No.: US 10,319,850 B2
(45) Date of Patent: Jun. 11, 2019

(54) SEMICONDUCTOR DEVICE AND MANUFACTURING METHOD OF SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventors: Saya Shimomura, Komatsu Ishikawa (JP); Toshifumi Nishiguchi, Hakusan Ishikawa (JP); Hiroaki Katou, Nonoichi Ishikawa (JP); Kenya Kobayashi, Nonoichi Ishikawa (JP); Takahiro Kawano, Nonoichi Ishikawa (JP); Tetsuya Ohno, Nomi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/916,447

(22) Filed: Mar. 9, 2018

(65) Prior Publication Data
US 2019/0088776 A1    Mar. 21, 2019

(30) Foreign Application Priority Data
Sep. 20, 2017    (JP) .................. 2017-180645

(51) Int. Cl.
*H01L 29/66*    (2006.01)
*H01L 29/78*    (2006.01)
(Continued)

(52) U.S. Cl.
CPC ........ *H01L 29/7813* (2013.01); *H01L 29/407* (2013.01); *H01L 29/4238* (2013.01); *H01L 29/66734* (2013.01)

(58) Field of Classification Search
USPC ........ 257/330, 329, 129, 334, 288, E21.409, 257/20, 331, 368, 401, 409, E29.198,
(Continued)

(56) References Cited

U.S. PATENT DOCUMENTS 8,198,678 B2    6/2012    Mauder et al.
8,502,305 B2    8/2013    Ohta et al.
(Continued)

FOREIGN PATENT DOCUMENTS

JP    3264262 B2    3/2002
JP    2002-158355 A    5/2002
(Continued)

*Primary Examiner* — Niki H Nguyen
(74) *Attorney, Agent, or Firm* — White & Case LLP

(57) ABSTRACT

According to one embodiment, a semiconductor device comprising a drain layer, a base region, a source region, a field plate electrode, and a gate region. The drift layer is formed on the drain layer. The base region is formed on the drift layer. The source region is formed on the base region. The field plate electrode is formed inside a trench reaching the drift layer through the base region from the source region. The gate region is formed inside the trench, wherein the gate region has a U-shape including a recess on the gate region in a direction along the trench and is formed such that, on upper surfaces of respective both ends of the U-shape, a position of an inner end on a side of the recess is higher than a position of an outer end on a side of the second insulating film.

13 Claims, 10 Drawing Sheets

(51) Int. Cl.
  *H01L 29/423* (2006.01)
  *H01L 29/40* (2006.01)
(58) Field of Classification Search
  USPC ........ 257/133, 328; 438/172, 268, 135, 158, 438/197
  See application file for complete search history.

(56) References Cited

U.S. PATENT DOCUMENTS

| | | | |
|---|---|---|---|
| 8,884,362 | B2 | 11/2014 | Matsuoka et al. |
| 8,969,157 | B2* | 3/2015 | Takahashi ............. H01L 29/401 |
| | | | 438/270 |
| 9,337,283 | B2 | 5/2016 | Nishiguchi |
| 9,947,751 | B2* | 4/2018 | Kobayashi ............ H01L 29/401 |
| 2002/0060339 | A1 | 5/2002 | Maruoka |
| 2011/0215399 | A1* | 9/2011 | Matsuura ................ H01L 29/78 |
| | | | 257/331 |
| 2013/0069147 | A1* | 3/2013 | Ohta ................... H01L 29/7813 |
| | | | 257/330 |
| 2013/0069150 | A1* | 3/2013 | Matsuoka ............. H01L 29/407 |
| | | | 257/330 |
| 2013/0153995 | A1 | 6/2013 | Misawa et al. |
| 2017/0222038 | A1 | 8/2017 | Katou et al. |

FOREIGN PATENT DOCUMENTS

| | | |
|---|---|---|
| JP | 2004-179464 A | 6/2004 |
| JP | 4501820 B2 | 7/2010 |
| JP | 2011-124576 A | 6/2011 |
| JP | 2013-065774 A | 4/2013 |
| JP | 2013-069791 A | 4/2013 |
| JP | 2013-125827 A | 6/2013 |
| JP | 2014-078741 A | 5/2014 |
| JP | 2014-212358 A | 11/2014 |
| JP | 2015-088738 A | 5/2015 |
| JP | 5799046 B2 | 10/2015 |
| JP | 2017-139262 A | 8/2017 |

* cited by examiner

SEMICONDUCTOR DEVICE AND MANUFACTURING METHOD OF SEMICONDUCTOR DEVICE

CROSS REFERENCE TO RELATED APPLICATIONS

This application is based upon and claims the benefit of priority from the prior Japanese Patent Application No. 2017-180645, filed on Sep. 20, 2017, the entire contents of which are incorporated herein by reference.

FIELD

The embodiments of the present invention relate to a semiconductor device and a manufacturing method of the semiconductor device.

BACKGROUND

A semiconductor device such as a power metal-oxide-semiconductor field-effect transistor (MOSFET) is widely used as a regulator or a switching element. For example, in a case where a wide trench is formed with a high breakdown voltage design, a film formation thickness of polysilicon is increased or deposition of the polysilicon is layered in two stages.

However, in such a structure, stress is increased and a warp of a wafer is increased. In addition, when a recess of the polysilicon of a gate electrode is formed, its shape becomes a mortar shape recessed in the center by dry etching, and in a case where a right above contact is formed, it is difficult to make a sufficient width to form a contact region in the gate electrode. Further, if a shape of the gate electrode is an acute angle in an insulating film interface separating a drain voltage and a gate voltage, electric field concentration tends to occur locally, and destruction of a gate insulating film is caused. On the other hand, if it is attempted to form the upper surface of the gate electrode flat, a process is required such as chemical mechanical polishing (CMP), and the number of manufacturing steps is increased.

DETAILED DESCRIPTION

According to one embodiment, a semiconductor device comprising a drain layer, a drift layer, a base region, a source region, a field plate electrode, a gate region and a third insulating film. The drain layer is formed of a first conductivity type. The drift layer of the first conductivity type is formed on an upper surface of the drain layer. The base region of a second conductivity type is formed on an upper surface of the drift layer. The source region of the first conductivity type is formed on an upper surface of the base region. The field plate electrode is formed inside a trench reaching the drift layer through the base region from an upper surface of the source region, along the trench via a first insulating film. The gate region is formed inside the trench via a second insulating film, wherein the gate region has a U-shape including a recess on an upper surface of the gate region in a direction along the trench and is formed such that, on upper surfaces of respective both ends of the U-shape, a position of an inner end on a side of the recess is higher than a position of an outer end on a side of the second insulating film. The third insulating film is formed on upper surfaces of the source region and the gate region and inside the recess.

Embodiment will now be explained with reference to the accompanying drawings. The present invention is not limited to the embodiments. The figures are illustrated to make the structure or manufacturing method easy to understand, and their dimensions, ratios, shapes of details, and the like are not necessarily as illustrated in the figures. For example, even a generally distorted plane is represented by a straight line.

(Structure)

First, a structure of a semiconductor device according to a present embodiment will be described. For convenience, expressions of "upper surface" and "lower surface" are used; however, those are phrases used for explanation and do not always maintain a vertical relationship with respect to the direction of gravity during use of the semiconductor device or the like. Similarly, the term "height" is generally an expression representing a vertical relationship; however, it does not always represent a vertical relationship during use of the semiconductor device or the like, and may represent a length in the horizontal direction. Here, the height means, for example, a distance from the lower surface of a drain region (the lower surface of a semiconductor substrate).

Figure 1A:
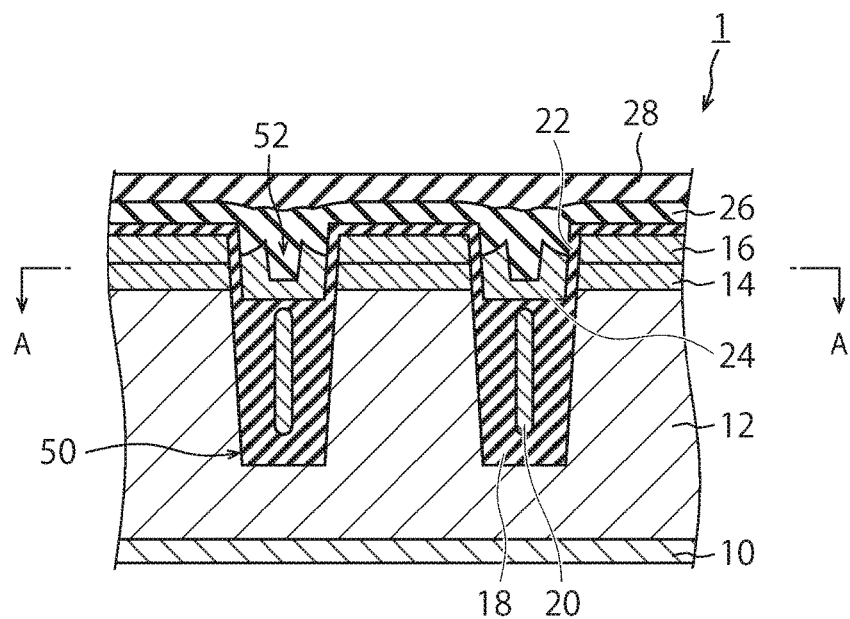
FIGS. 1A and 1B each are a cross-sectional view schematically illustrating a semiconductor device according to an embodiment.
Figure 1B:
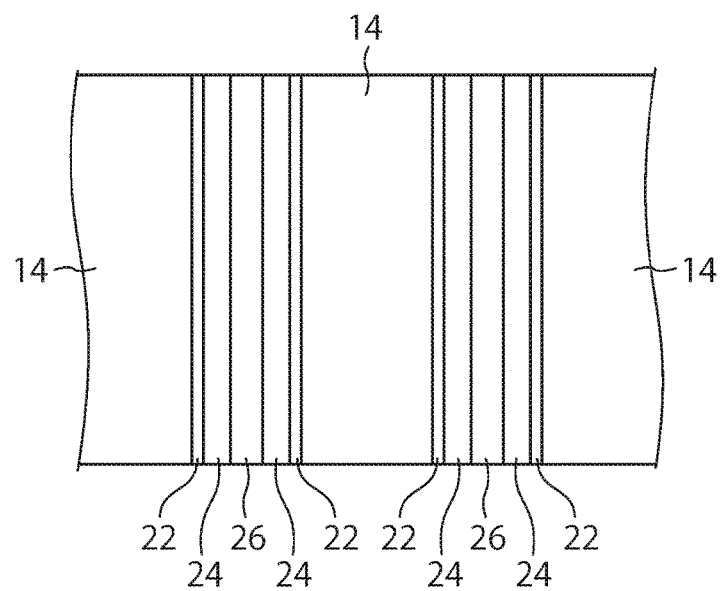

FIGS. 1A and 1B each are a schematic view of the semiconductor device according to the embodiment. FIG. 1A is a cross-sectional view, and FIG. 1B is an A-A cross-sectional view of FIG. 1A.

As illustrated in FIG. 1A, a semiconductor device 1 includes a drain layer 10, a drift layer 12, a base region 14, a source region 16, a first insulating film 18, a field plate electrode 20, a second insulating film 22, a gate region 24, an interlayer insulating film 26, and an interlayer insulating film 28. The semiconductor device 1 configures, for example, a power MOSFET.

To explain the structure of the semiconductor device 1 in an easy-to-understand manner, a contact and a metal layer for applying a voltage to each region are not illustrated in the cross section. As will be described later, for example, a barrier metal 30 and a gate metal 32 are provided connected to the gate region 24 from the upper surface of the semiconductor device 1, through the interlayer insulating film 26 and the interlayer insulating film 28.

The drain layer 10 is a layer that forms a drain in a trench type (vertical type) power MOSFET, and is formed of a semiconductor of a first conductivity type, for example, an $n^+$-type semiconductor. The drain layer 10 is connected, on the lower surface thereof, to a drain metal 38.

The drift layer 12 is formed of the semiconductor of the first conductivity type, for example, an $n^-$-type semiconductor. The drift layer 12 is provided such that the lower surface thereof is in contact with the upper surface of the drain layer 10.

The base region 14 is provided such that the lower surface thereof is in contact with the upper surface of the drift layer 12. The base region 14 is formed of a semiconductor of a second conductivity type, for example, a p-type semiconductor, and is a region that forms a channel and enables carriers to flow from the source region 16 to the drain layer 10 in a case where a voltage is applied to the gate region 24.

The source region 16 is provided such that the lower surface thereof is in contact with the upper surface of the base region 14. The source region 16 is formed of the semiconductor of the first conductivity type, for example, an $n^+$-type semiconductor, and the carriers flow from the source region 16 to the drain layer 10 by a potential difference between the source region 16 and the drain layer 10 in a case where a voltage is properly applied to the gate region 24.

A trench 50 is provided to reach the middle of the drift layer 12 from upper surfaces of the drift layer 12, the base region 14, and the source region 16, that is, from the upper surface of the source region 16. With the presence of the trench 50, the base region 14 and the source region 16 are selectively provided on the upper surface of the drift layer 12.

The first insulating film 18 is, for example, a field plate insulating film, and is an insulating film that insulates the field plate electrode 20 from the drift layer 12. The first insulating film 18 is provided in the trench 50 to insulate the field plate electrode 20 from the drift layer 12.

The field plate electrode 20 is provided in the trench 50 via the first insulating film 18 along a direction of the trench 50 in a direction from the drain layer 10 to the source region 16, that is, in the vertical direction. The field plate electrode 20 is formed, for example, with polysilicon. The field plate electrode 20 may be connected to a source electrode.

The field plate electrode 20 is depicted as a single body; however, not limited thereto, the field plate electrode 20 may be formed of a plurality of different types of conductors or semiconductors. For example, at a position that faces the drift layer 12 via the first insulating film 18 and is the lower side close to the drain layer 10, another semiconductor film may be provided between the field plate electrode 20 and the first insulating film 18.

The second insulating film 22 is an insulating film that insulates the base region 14 and the source region 16 from the gate region 24, and is provided along the base region 14 and the source region 16 in the trench 50. The second insulating film 22 may be provided to be contiguous with the first insulating film 18. In addition, depending on a region where the base region 14, the source region 16, and the gate region 24 are formed, the second insulating film 22 may also be provided between the drift layer 12 and the gate region 24. As described above, the second insulating film 22 is provided between the gate region 24 and the base region 14, and functions as a gate oxide film for insulating these regions.

Figure 4A:
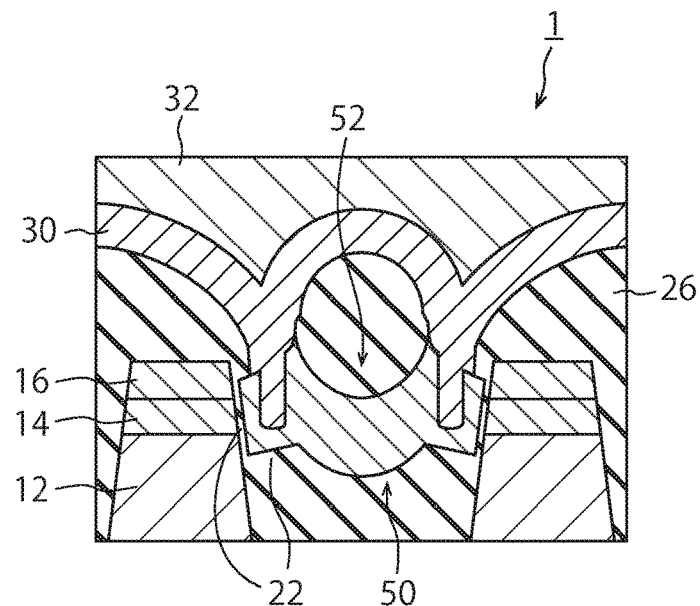
FIGS. 4A and 4B each are a schematic view illustrating a state in which a gate metal and a gate region are connected together according to the embodiment.
Figure 4B:
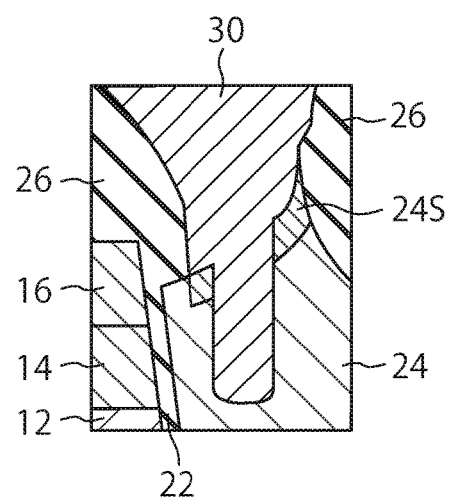

The gate region 24 is a region for forming a channel or a depletion layer in the base region 14 by the applied voltage, and is provided as a conductor of a U-shape. The gate region 24 is formed, for example, with polysilicon. The gate region 24 is provided, from the upper surface thereof, with a recess 52. The recess 52 does not penetrate through the gate region 24, and is provided such that the gate region 24 has a U-shape. The recess 52 may be a concave depression as illustrated in FIGS. 4A and 4B.

The interlayer insulating film 26 is an insulating film for insulating the gate region 24 from the metal layer formed on the upper surface thereof, and is provided on the upper surface of the second insulating film 22 and the upper surface of the gate region 24. In particular, the interlayer insulating film 26 is provided to be buried in the recess 52 formed in the gate region 24.

The interlayer insulating film 28 is an insulating film formed on the upper surface of the interlayer insulating film 26 to insulate the above-described semiconductor layers from the metal layer. The interlayer insulating film 28 and the interlayer insulating film 26 form a third insulating film. Further, the interlayer insulating film 28 may also be formed at the timing of forming the interlayer insulating film 26. As described above, the interlayer insulating film 26 and the interlayer insulating film 28 are identical, and the insulating film identically formed may form the third insulating film. After forming the interlayer insulating film 26, the third insulating film may be formed by planarizing the upper surface.

FIG. 1B is a view illustrating the A-A cross-section in FIG. 1A, that is, a schematic plane. Each of the above layers is formed along a direction orthogonal to a direction in which the layers of the semiconductor are layered. The metal layer is provided on the upper portion of these semiconductor layers, more specifically, on the upper surface of the third insulating layer (interlayer insulating film 28), and is in contact with necessary portions of the source region 16, the field plate electrode 20, the gate region 24, and the like.

Figure 2:
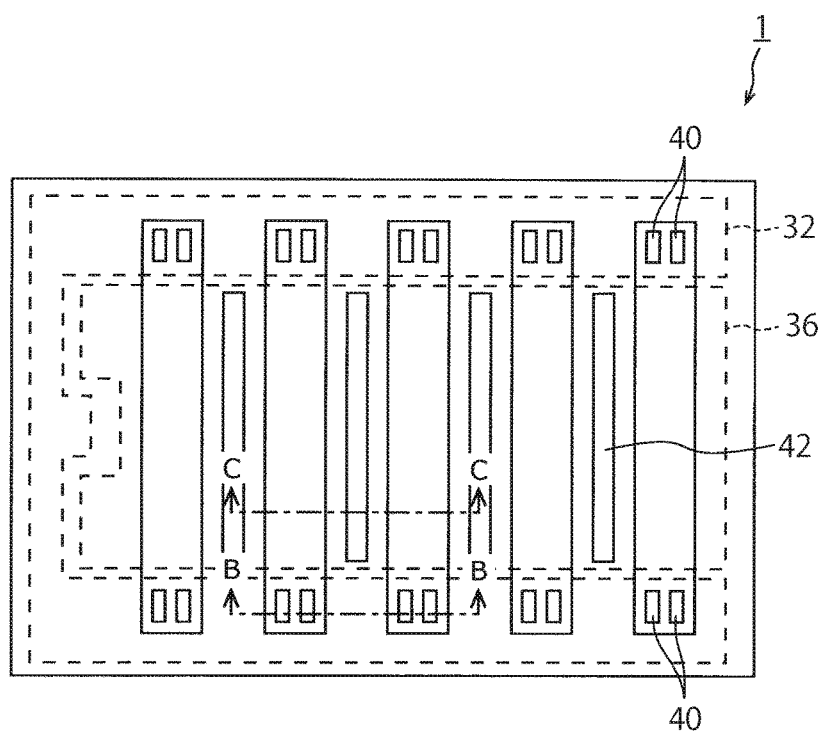
FIG. 2 is a plan view schematically illustrating the semiconductor device according to the embodiment.

FIG. 2 is a plan view illustrating a schematic upper surface of the semiconductor device 1 after various contacts and metals are formed. On the upper surface of the semiconductor layer including the drift layer 12 and the like, a source metal 36 is provided to be connected to the source region 16, the field plate electrode 20, and the base region 14 so that the gate metal 32 is connected to the gate region 24 via a gate contact 40. FIG. 2 illustrates five trenches 50; however, it is illustrated as an example, and not limited thereto, more trenches 50 may be provided.

The gate contact 40 is electrically connected to the gate region 24 in the trench 50. A source contact 42 is provided between the two trenches 50 to reach the base region 14 through the source region 16 in the semiconductor layer and such that its region and the trench 50 are not adjacent to each other.

The gate metal 32 is formed to be connected to the gate region 24 via each gate contact 40.

The source metal 36 is formed to be insulated from the gate metal 32 by an insulating film, to be connected to each source contact 42.

The drain metal 38 is formed to be in contact with the lower surface of the drain layer 10, to be connected to the drain layer 10.

Figure 3A:
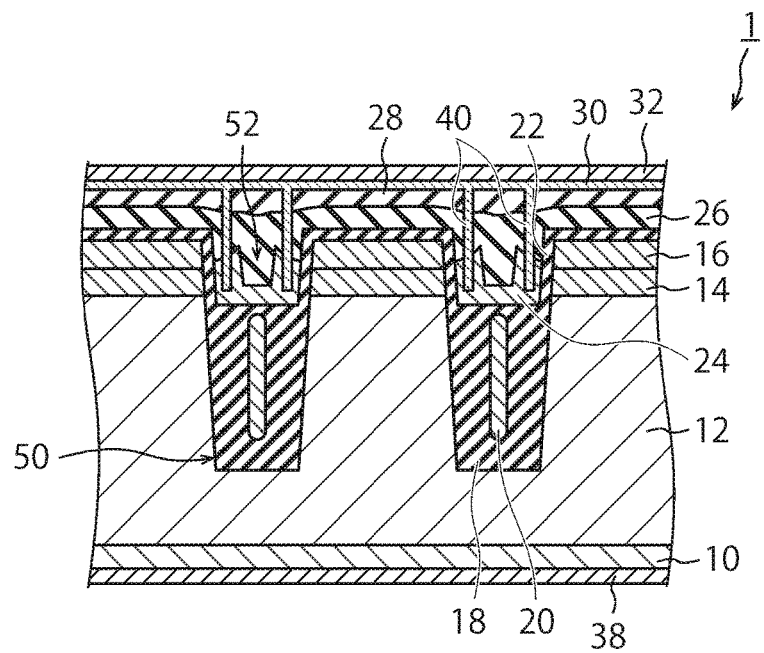
FIGS. 3A and 3B are cross-sectional views of respective parts in FIG. 2.
Figure 3B:
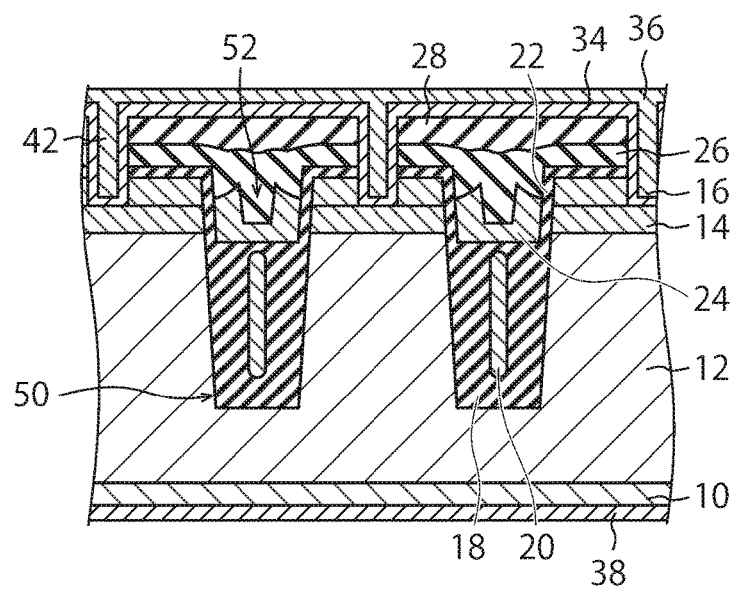

FIGS. 3A and 3B are cross-sectional views respectively illustrating a B-B cross-section and a C-C cross-section in FIG. 2.

FIG. 3A illustrates the B-B cross section, that is, a cross-sectional view including the gate contact 40. For example, the gate contact 40 is formed of the barrier metal 30, and electrically connects the gate metal 32 on the upper surface and the gate region 24 in the lower side together. The gate contact 40 is not necessarily formed entirely of the barrier metal 30 but may be formed of the barrier metal 30 and the gate metal 32. That is, the barrier metal 30 may be formed as a thin film on the inner wall to be a boundary surface between the third insulating film and a region in which the gate contact 40 is formed, and also to be a boundary between the gate region 24 and the region in which the gate contact 40 is formed, and the gate metal 32 may be formed via the barrier metal 30 as the gate contact 40.

FIG. 3B is the C-C cross-section, that is, a cross-sectional view including the source contact 42. The source contact 42 is formed to reach the base region 14 through the third insulating film and the source region 16. A barrier metal 34 is formed on the inner wall of the source contact 42, and the source metal 36 is formed in the inside of the barrier metal 34. By this source contact 42, the source metal 36, the base region 14, and the source region 16 are electrically connected together.

FIG. 4A is an enlarged view of the upper surface of the gate region in FIG. 3A, illustrating an example in which the barrier metal 30 is formed in the gate contact 40, and the gate region 24 and the gate metal 32 are electrically connected together. As illustrated in FIG. 4A, the gate region 24 need not have a complete U-shape, and it is sufficient that the gate region 24 is formed in a mortar shape recessed in the center. In addition, a bottom surface of the gate region 24 need not be a flat surface, and may have some unevenness.

FIG. 4B is a further enlarged view of a connecting portion between the gate region and the gate contact of FIG. 4A.

The gate region 24 is provided such that its formed angle is an obtuse angle in the outer end being in contact with the second insulating film 22, that is, in a region close to the source region 16. On the inner end on the side of the recess 52 opposite to the source region 16, the gate region 24 is formed to have an acute angle such that the height from the lower surface is higher than the source region 16 side having the obtuse angle. Not limited to the height from the lower surface, it is sufficient that the inside (recess side) is formed to be higher than the outside (source region 16 side), along the direction of the trench 50 and the recess 52. In addition, as illustrated in FIGS. 1A, 1B, 4A, and 4B, the shape may be such that the height gradually increases from the outside toward the inside, or there are places where the height does not change partially.

A silicide region 24S is formed between the gate region 24 and the barrier metal 30. The gate region 24 and the barrier metal 30 are brought into ohmic contact by this silicide region 24S. Since the gate region 24 has an acute angle in the recess 52 side, a contact surface with the barrier metal 30 can be secured wider than a general semiconductor device, and a region of the silicide region 24S is widened.

As described above, according to the semiconductor device 1 of the present embodiment, by making the inside (recess 52 side) higher than the outside (source region 16 side) of the gate region 24, the acute angle is obtained near the inside, and it is possible to provide a contact right above the gate region 24 to be in contact with the barrier metal 30, and the surface area of the silicide can be increased. As a result, the ohmic contact region becomes wider, and contact resistance between the gate region 24 and the barrier metal 30 can be reduced.

By forming the U-shape, it is possible to obtain a sufficient margin of the depth of the contact at both ends of the upper surface. In addition, since the formation angle is an obtuse angle on the outside, it is possible to avoid electric field concentration at the outside, and it is possible to suppress occurrence of failure and destruction. Further, with such a shape, as will be described later, it is possible to change the channel length on the left and right, and it is possible to suppress overshoot during high speed switching operation. In addition, the gate region 24 is not formed uniformly in the trench 50, and is formed in the U-shape, and a volume of the gate region 24 formed of, for example, polysilicon is reduced, whereby stress can be suppressed and a warp of the semiconductor device 1 can be reduced.

In the above description, it is described that the first conductivity type is an n-type, but the first conductivity type may be a p-type. In this case, the second conductivity type is the n-type. In a case of the n-type, examples of impurities include arsenic (As), phosphorus (P), and the like. In a case of the p-type, examples of impurities include boron (B), boron fluoride ($BF_2^+$), and the like.

In either case, main components of the drain layer 10, the drift layer 12, the base region 14, and the source region 16 are, for example, silicon (Si). Main components of the field plate electrode 20 and the gate region 24 are, for example, polysilicon containing impurities of the first conductivity type, amorphous silicon, and the like. The main components of the first insulating film 18, the second insulating film 22, and the third insulating film (the interlayer insulating film 26, the interlayer insulating film 28) are, for example, silicon oxide ($SiO_2$).

The structure as described above can be confirmed by examining the cross section by a method that can investigate the sample at a high magnification, such as SEM or TEM.

(Manufacturing Method)

Next, a manufacturing method of the semiconductor device 1 according to the present embodiment will be described.

Figure 5A:
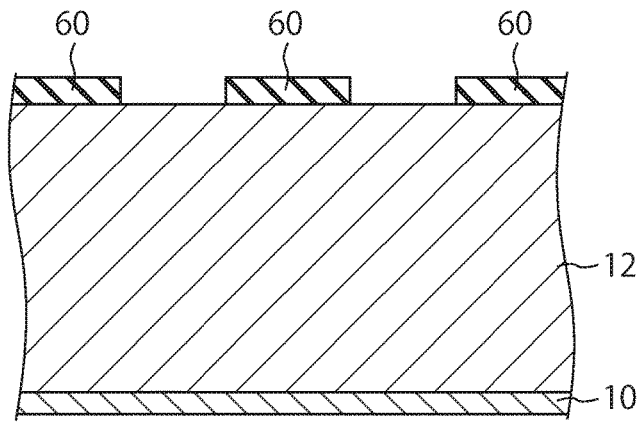
FIGS. 5A to 9C are cross-sectional views schematically illustrating a manufacturing process of the semiconductor device according to the embodiment.
Figure 5B:
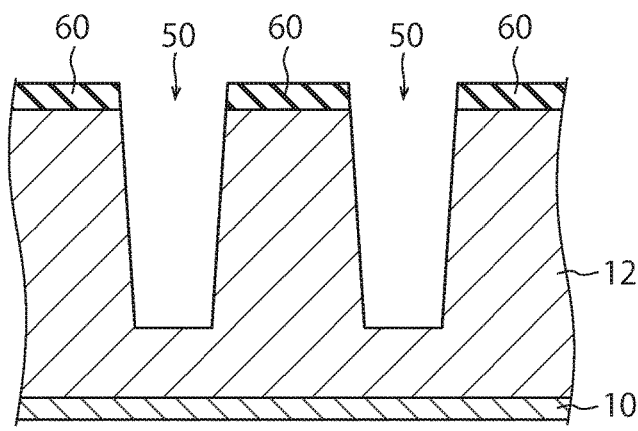
Figure 5C:
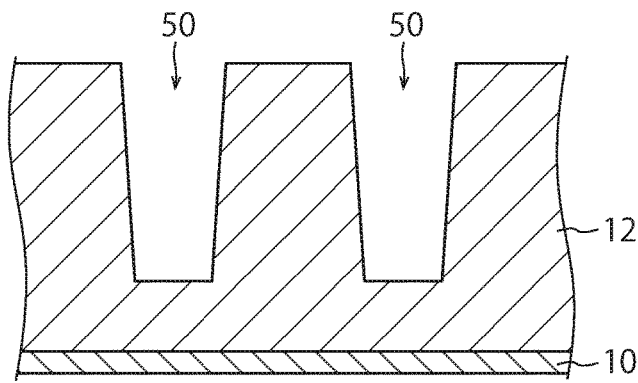

FIGS. 5A to 5C are views illustrating a process of forming the trench 50 in the drain layer 10 and the drift layer 12. As illustrated in FIG. 5A, layers to be the drain layer 10 and the drift layer 12 are formed on a semiconductor substrate. For example, the drain layer 10 is the semiconductor substrate, and the drift layer 12 is formed on the drain layer 10 by epitaxial growth. Alternatively, a wafer-like semiconductor layered body in which the drift layer 12 is formed may be connected to the upper surface of the drain layer 10.

Then, on the drift layer 12, the trench is selectively formed from the upper surface of the drift layer 12 toward the drain layer 10. As an example, as illustrated in FIG. 5A, a mask 60 (photo resist) is formed by photolithography. Subsequently, as illustrated in FIG. 5B, for example, through a process of reactive ion etching (RIE), as illustrated in FIG. 5C, the mask 60 is removed, and the trench 50 is formed on the upper surface of the drift layer 12.

Figure 6A:
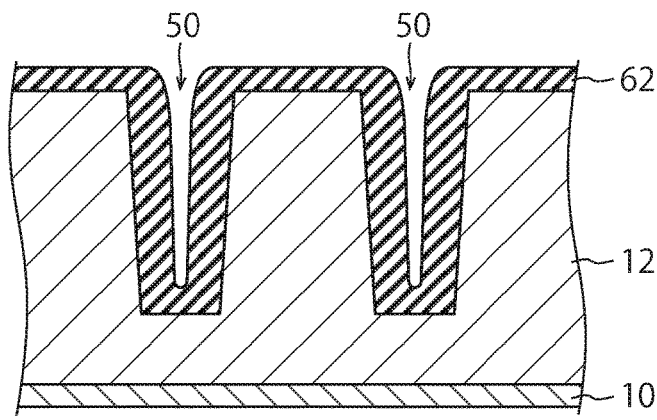
Figure 6B:
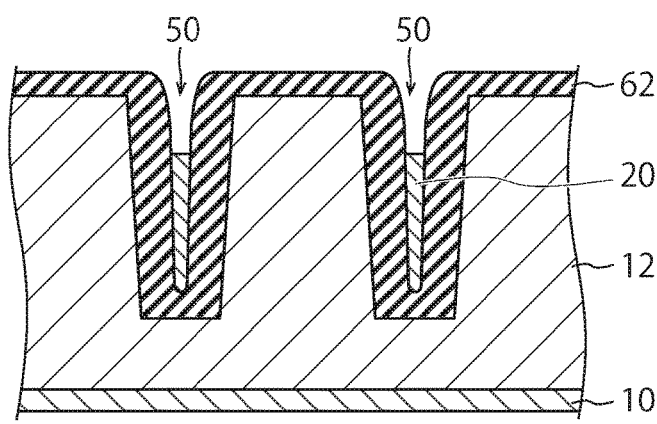
Figure 6C:
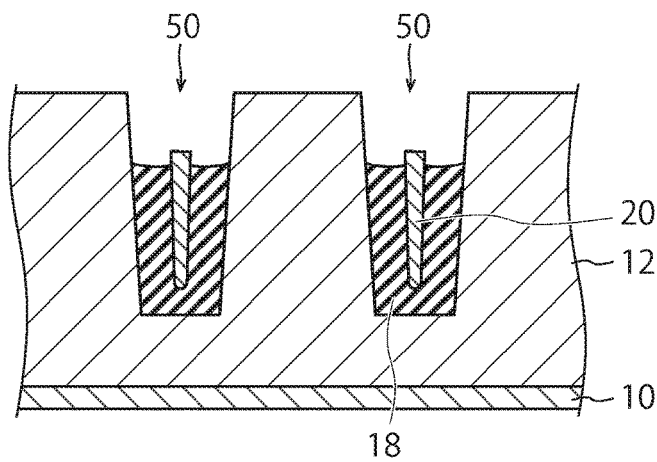

FIGS. 6A to 6C are views illustrating a process of forming the field plate electrode 20. First, the first insulating film 18 is formed in the trench 50. As illustrated in FIG. 6A, an insulating film 62 is formed on the upper surface of the drift layer 12 and the inner wall of the trench 50 by, for example, a thermal oxidation method or chemical vapor deposition (CVD) or the like.

Next, as illustrated in FIG. 6B, the field plate electrode 20 is formed in the trench 50 via the first insulating film 18. The field plate electrode 20 is formed by, for example, CVD or the like. The field plate electrode 20 may be polysilicon containing no impurities. As another example, after forming an electrode containing polysilicon or amorphous silicon, the field plate electrode 20 may be formed by exposing the electrode to a phosphorus oxychloride ($POCl_3$) atmosphere and thermally diffusing the phosphorus (P). As yet another example, phosphorus (P) may be diffused into the field plate electrode 20 while mixing phosphine ($PH_3$) or the like in silane ($SiH_4$) or the like and maintaining a reduced pressure state during CVD.

Next, as illustrated in FIG. 6C, the first insulating film 18 is selectively etched until the upper surface of the field plate electrode 20 becomes higher than the upper surface of the first insulating film 18. For example, etching is performed by chemical dry etching (CDE) or wet etching. Further, the field plate electrode 20 may be etched back.

Figure 7A:
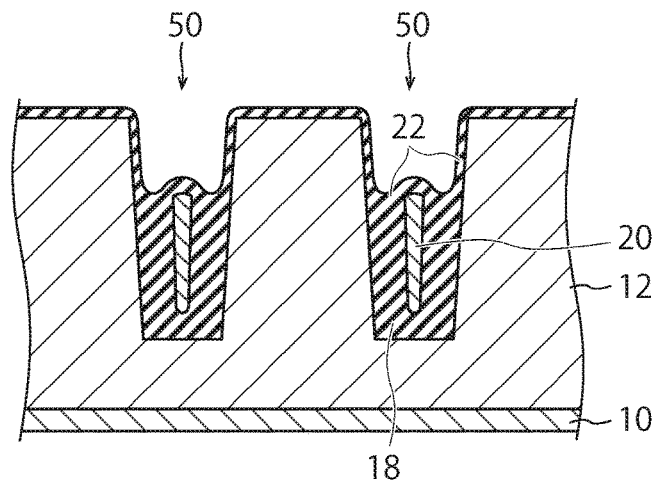
Figure 7B:
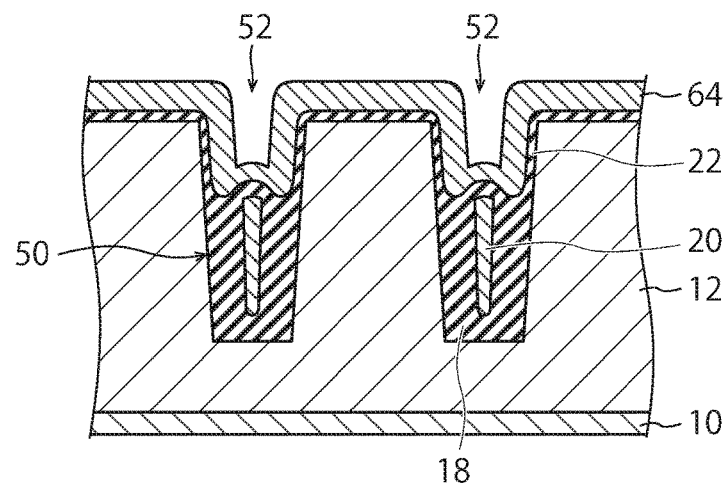

FIGS. 7A and 7B are views illustrating a process of forming electrodes to be the second insulating film 22 and the gate region 24. First, as illustrated in FIG. 7A, the second insulating film 22 is formed by the thermal oxidation method, CDV or the like, on the upper surface of the drift layer 12 and an inner side surface of the trench 50, to cover the upper surfaces of the first insulating film 18 and the field plate electrode 20.

Next, as illustrated in FIG. 7B, a conductive film 64 to be the gate region 24 is formed in the trench 50 via the second insulating film 22. In this process, the conductive film 64 is formed not to fill all in the trench 50, so that the recess 52 is formed in the inside of the gate region 24.

The conductive film 64 (gate region 24) is formed by, for example, CVD or the like. The conductive film 64 may be polysilicon containing no impurities. As another example, n-type impurities may be thermally diffused into polysilicon at this timing. For example, polysilicon containing no impurities or amorphous silicon is once formed and then exposed to a phosphorus oxychloride (POCl$_3$) atmosphere, and phosphorus (P) is thermally diffused into the polysilicon, whereby the conductive film 64 may be formed. As yet another example, phosphorus (P) may be diffused into the conductive film 64 while mixing a phosphine (PH$_3$) or the like in silane (Sift) or the like and maintaining a reduced pressure state during CVD.

Figure 8A:
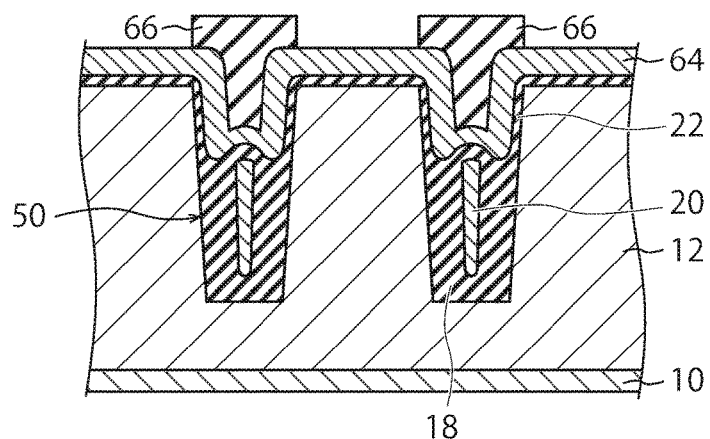
Figure 8B:
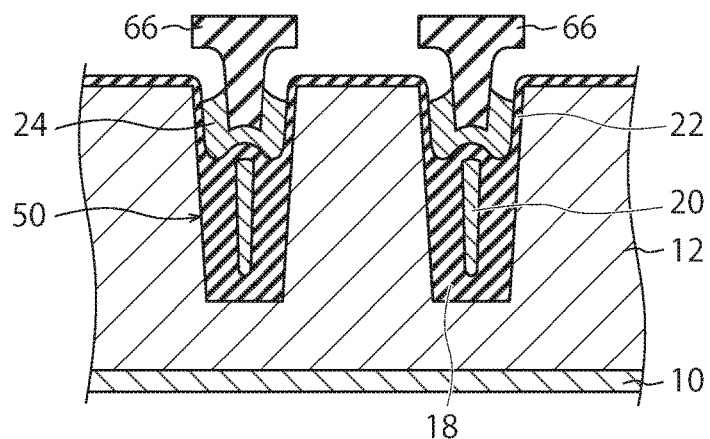
Figure 8C:
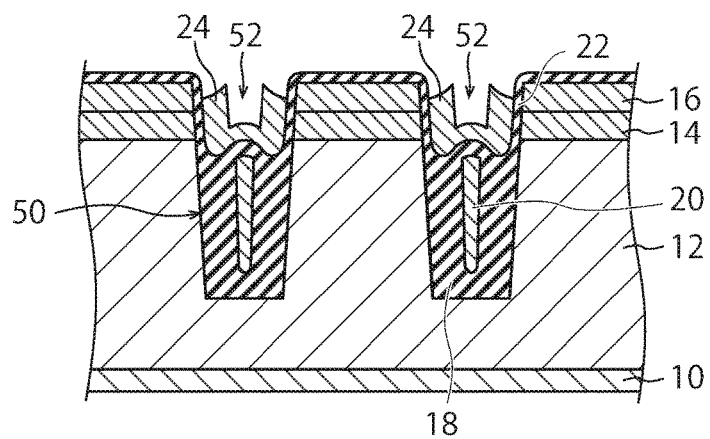

FIGS. 8A to 8C are views illustrating a process of forming the U-shape of the gate region 24. First, as illustrated in FIG. 8A, a mask 66 is formed in the recess 52 formed in the conductive film 64 and the upper surface in the periphery thereof. The mask 66 is selectively formed in the recess 52 of the conductive film 64 and the upper surface of the conductive film 64 by, for example, photolithography or reactive ion etching (RIE), after a material, which forms the mask 66, is formed entirely of the upper surface of the semiconductor layer formed by the process described in FIG. 7B.

Next, as illustrated in FIG. 8B, the conductive film 64 is etched to form the gate region 24. The conductive film 64 is etched by, for example, CDE or wet etching. On this etching process, at first, the conductive film 64 is selectively etched from upper surface thereof. Subsequently, the conductive film 64, remaining under the mask 66, is etched from both sides of under the mask 66 to form a U-shape gate region. Consequently, the gate region 24 is formed of the U-shape as illustrated. These etchings may be performed as one etching step. That is, the conductive film 64 between the masks 66 is gradually etched from the upper surface, and then the upper surface of the conductive film 64 and the conductive film 64 under the mask 66 is gradually etched on the same timing. Thus, the gate region 24 is formed such that on upper surfaces of respective both ends of the U-shape, a position of an inner end on a side of the recess (side of the mask 66) is higher than a position of an outer end on a side of the second insulating film 22. The shape of the mask 66 forms the difference between the positions of each ends. At this timing, the base region 14 and the source region 16 are formed.

The base region 14 and the source region 16 are formed by counter-ion implantation, for example. For example, on the upper surface of the drift layer 12, p-type impurities (B$^+$, BF$_2^+$ and the like) whose concentration exceeds a concentration of n-type impurities of the drift layer 12 are implanted to the depth at which the base region 14 is formed. Subsequently, from the surface of the base region 14 formed, n-type impurities (P$^+$, As$^+$ and the like) whose concentration exceeds the concentration of the p-type impurities in the base region 14 are implanted to the depth at which the source region 16 is formed. In this way, the base region 14 and the source region 16 are formed. At this time, the insulating film on the drift layer 12 may be removed once.

Next, as illustrated in FIG. 8C, the mask 66 is removed to form the recess 52 in the gate region 24. Removal of the mask 66 is performed by, for example, photoexcitation ashing, plasma ashing, or chemical solution. The resist removal method may be determined by the process of forming the mask 66.

Figure 9A:
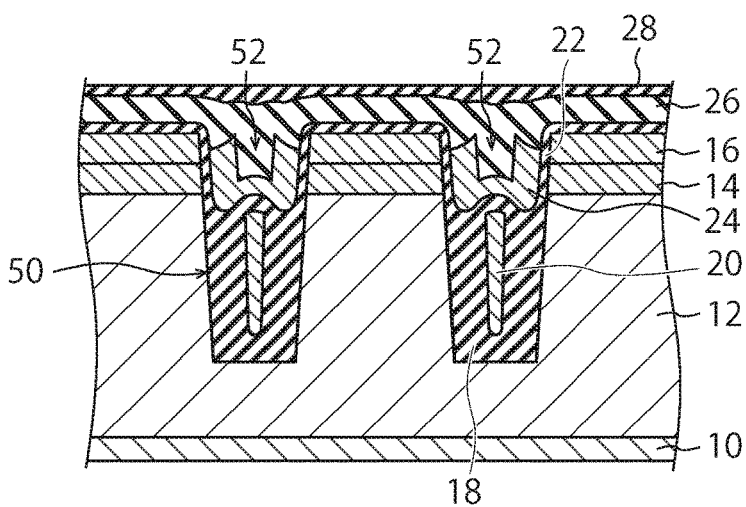
Figure 9B:
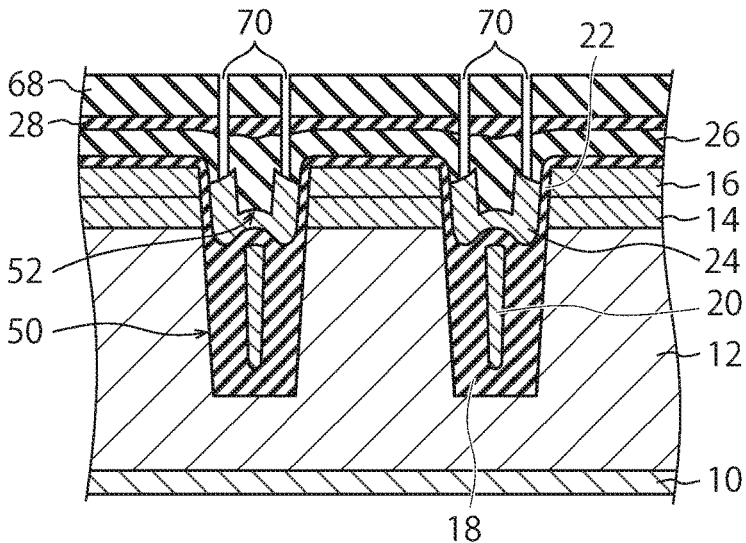
Figure 9C:
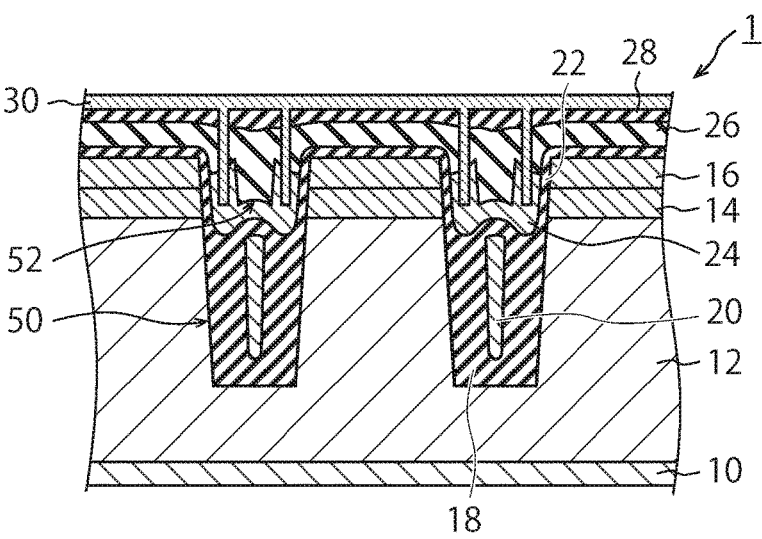

FIGS. 9A to 9C are views illustrating a process after forming the gate region 24. First, as illustrated in FIG. 9A, the interlayer insulating film 26 and the interlayer insulating film 28 are formed such that the recess 52 is filled. This formation is performed by, for example, forming the interlayer insulating film 26 by reflow, then forming the interlayer insulating film 28 by CVD, and planarizing the surface by chemical mechanical polishing (CMP). The third insulating film is formed of the interlayer insulating film 26 and the interlayer insulating film 28.

As described in the above description of the structure, the interlayer insulating film 26 and the interlayer insulating film 28 need not be divided into two insulating films, and may be formed as one insulating film (third insulating film). In this case, for example, the third insulating film (interlayer insulating film 26 and interlayer insulating film 28) is formed by CVD, and planarized by CMP.

Next, as illustrated in FIG. 9B, a mask 68 is formed on the upper surface of the third insulating film. The process of forming the mask 68 is equivalent to the process of forming the mask 60 or the mask 66. The mask 68 is formed such that a contact region can be selectively etched at the upper end of the U-shape of the gate region 24. Then, a contact 70 to the gate region 24 is formed by etching, for example, dry etching (plasma etching).

Next, as illustrated in FIG. 9C, after removing the mask 68, the barrier metal 30 is formed. The barrier metal 30 is, for example, a thin film including titanium (Ti) or titanium nitride (TiN). The barrier metal is formed by sputtering, for example. The contact 70 may be filled with the barrier metal 30, or the inner wall of the contact 70 may be covered by the barrier metal 30, and in the contact 70 covered, the gate metal 32 may be formed in the next step.

Next, as illustrated in FIG. 3A, a metal is formed on the upper surface of the barrier metal 30, whereby the gate metal 32 is formed. The gate metal 32 is formed of, for example, a metal including aluminum (Al). The gate metal 32 is formed by, for example, CVD or physical vapor deposition (PVD). In this way, the contact 70 is formed as the gate contact 40, and the gate metal 32 and the gate region 24 are electrically connected together.

In parallel with this step, or in steps before and after this step, the barrier metal 34, the source contact 42, and the source metal 36 are formed. These methods of forming are performed through processes similar to those of the barrier metal 30, the gate contact 40, and the gate metal 32.

Finally, heat treatment is performed as necessary. By performing this heat treatment, the semiconductor layers, in particular the base region 14 and the source region 16, are activated, and silicide is formed at the contact surface between the gate region 24 and the barrier metal 30.

As described above, according to the present embodiment, by forming the gate region 24 in the U-shape such that its height increases from the outside toward the inside, planarization processing for the gate region 24 can be omitted, for example, CMP processing.

(Modification)

In FIG. 8A, it is also possible to form semiconductors with different threshold voltages on the left and right of the gate region of the U-shape by displacing positions of resist when generating the resist.

Figure 10A:
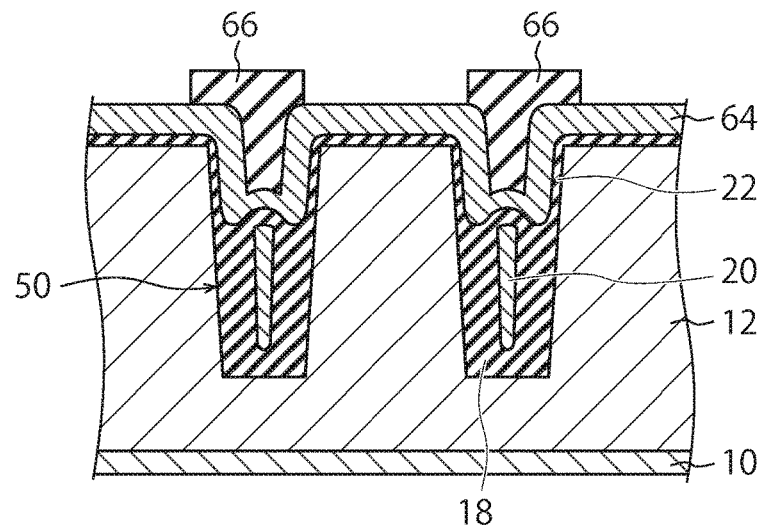
FIGS. 10A and 10B are cross-sectional views schematically illustrating another example of the semiconductor device according to the embodiment.
Figure 10B:
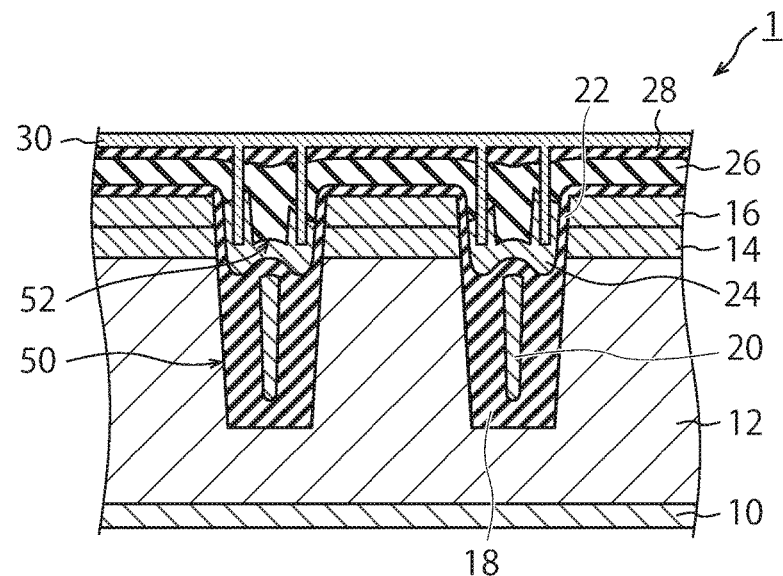

FIGS. 10A and 10B are views illustrating a manufacturing process according to a present modification. FIG. 10A is a view illustrating the modification of processing of forming the resist in FIG. 8A. As illustrated in FIG. 10A, for example, in the two trenches 50 arranged side by side, the masks 66 are formed at positions to be separated from each other more than the case of the above-described embodiment. That is, the center position in a direction perpendicular to the trench of each of the mask 66 is shifted from the center of the recess 52, respectively. With this configuration, in the figure, etching of the conductive film 64 in the trench 50 positioned on the outside does not proceed so much, whereas the etching of the conductive film 64 in the trench 50 positioned on the inside is promoted compared to the outside.

By shifting the position of the mask 66 in this way, or changing the size of the mask 66, it is possible to change the depth of the recess of the conductive film 64 that is etched in the left and right of the U-shape in the subsequent CDE process.

FIG. 10B is a view illustrating the semiconductor device 1 generated in this way, and as illustrated in this figure, it is possible to change the height of the region sandwiching the recess 52 of the gate region 24, and it is possible to change the gate-source threshold voltage.

As described above, according to the present modification, by a small process change such as shifting the position of the mask 66 or changing the size, it is possible to manufacture the semiconductor device 1 having different threshold voltages on the left and right of the recess 52.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
    a drain layer of a first conductivity type;
    a drift layer of the first conductivity type formed on an upper surface of the drain layer;
    a base region of a second conductivity type formed on an upper surface of the drift layer;
    a source region of the first conductivity type formed on an upper surface of the base region;
    a field plate electrode formed inside a trench reaching the drift layer through the base region from an upper surface of the source region, along the trench via a first insulating film;
    a gate region formed inside the trench via a second insulating film, wherein the gate region has a U-shape including a recess on an upper surface of the gate region in a direction along the trench and is formed such that, on upper surfaces of respective both ends of the U-shape, a position of an inner end on a side of the recess is higher than a position of an outer end on a side of the second insulating film; and
    a third insulating film formed on upper surfaces of the source region and the gate region and inside the recess.

2. The semiconductor device according to claim 1, wherein the gate region is formed to have an obtuse angle on a contact side with the side of the second insulating film and an acute angle on the side of the recess, between a upper surface and a side surface, on the upper surfaces of the both ends of the U-shape.

3. The semiconductor device according to claim 1, further comprising a gate contact reaching at least the upper surface of the gate region, selectively in a region other than the recess, through the third insulating film from an upper surface of the third insulating film.

4. The semiconductor device according to claim 2, further comprising a gate contact reaching at least the upper surface of the gate region, selectively in a region other than the recess, through the third insulating film from an upper surface of the third insulating film.

5. The semiconductor device according to claim 3, wherein a silicide layer is provided between the gate contact and the gate region, on the upper surface of the gate region.

6. The semiconductor device according to claim 4, wherein a silicide layer is provided between the gate contact and the gate region, on the upper surface of the gate region.

7. The semiconductor device according to claim 3, wherein the gate contact is formed to reach both of two upper surfaces of the U-shape formed by the gate region.

8. The semiconductor device according to claim 6, wherein the gate contact is formed to reach both of two upper surfaces of the U-shape formed by the gate region.

9. The semiconductor device according to claim 1, wherein heights of the both ends of the U-shape are different from each other in the gate region.

10. A manufacturing method of a semiconductor device, the method comprising:
    forming a trench, in a drift layer of a first conductivity type formed on an upper surface of a drain layer of a first conductivity type, from an upper surface side of the drift layer toward the drain layer of the drift layer;
    forming a first insulating film on an inner wall of the trench;
    forming a field plate electrode inside of the trench via the first insulating film;
    forming a second insulating film on an upper surface of the field plate electrode, the inner wall of the trench, and upper surface of the drift layer;
    forming a conductive film, via the second insulating film, on the inner wall of the trench and on the upper surface of the drift layer, the conductive film comprising a recess in the trench;
    forming a mask in the recess and the upper surface in the periphery of the recess;
    etching the conductive film from the upper surface of the conductive film and from both sides of the mask to form a gate region of a U-shape;
    removing the mask to form the recess on a surface of the gate region;
    forming a base region on an upper surface of the drift layer other than the trench;
    forming a source region on an upper surface of the base region;
    forming a third insulating film on an upper surface of the source region and an upper surface of the gate region to fill the recess; and forming a gate contact reaching the gate region through the third insulating film.

11. The manufacturing method of a semiconductor device according to claim 10, wherein, in etching the conductive film, the conductive film etched such that, on upper surfaces of respective both ends of the U-shape of the gate region, a position of an inner end on a side of the recess is higher than a position of an outer end on a side of the second insulating film.

12. The manufacturing method of a semiconductor device according to claim 10, further comprising forming a silicide layer between the gate region and the gate contact.

13. The manufacturing method of a semiconductor device according to claim 10, wherein, in forming the mask, the mask formed at position of each center of the mask shifting from each center of the recess, forming the gate region such that heights of the both ends of the U-shape are different from each other.

* * * * *